(12) United States Patent
King et al.

(10) Patent No.: US 7,064,547 B1
(45) Date of Patent: Jun. 20, 2006

(54) METHOD AND APPARATUS OF M/R IMAGING WITH COIL CALIBRATION DATA ACQUISITION

(75) Inventors: Kevin F. King, New Berlin, WI (US); Elisabeth Angelos, Hartland, WI (US); Jason A. Polzin, Lake Mills, WI (US)

(73) Assignee: General Electric Company, Schenectady, NY (US)

( * ) Notice: Subject to any disclaimer, the term of this patent is extended or adjusted under 35 U.S.C. 154(b) by 1 day.

(21) Appl. No.: 10/710,133

(22) Filed: Jun. 21, 2004

(51) Int. Cl.
*G01V 3/00* (2006.01)

(52) U.S. Cl. .................................................. 324/309
(58) Field of Classification Search ................ 324/307, 324/309
See application file for complete search history.

(56) References Cited

U.S. PATENT DOCUMENTS

| | | | | |
|---|---|---|---|---|
| 5,604,434 | A * | 2/1997 | Schomberg | 324/309 |
| 6,289,232 | B1 * | 9/2001 | Jakob et al. | 600/410 |
| 6,717,406 | B1 | 4/2004 | Sodickson | |
| 2002/0158632 | A1 * | 10/2002 | Sodickson | 324/307 |
| 2003/0055330 | A1 * | 3/2003 | King et al. | 600/410 |
| 2004/0263167 | A1 * | 12/2004 | Machida et al. | 324/309 |
| 2005/0007113 | A1 * | 1/2005 | Hoogeveen et al. | 324/309 |

OTHER PUBLICATIONS

Jakob P.M. et al., "AUTO SMASH: A self-calibrating technique for SMASH imaging," *Magnetic Resonance Materials in Physics, Biology and Medicine* 7 (1998) 42-54.
Sodickson D.K. et al., "Simultaneous Acquisition of Spatial Harmonics (SMASH): Fast Imaging with Radiofrequency Coil Arrays," *MRM* 38:591-603 (1997).
Pruessmann K.P. et al., "SENSE: Sensitivity Encoding for Fast MRI," *Magnetic Resonance in Medicine* 42:952-962 (1999).
Griswold M.A. et al., "Generalized Autocalibrating Partially Parallel Acquisitions (GRAPPA)," *Magnetic Resonance in Medicine* 47:1202-1210 (2002).
McKenzie C.A. et al., "Self-Calibrating Parallel Imaging with Automatic Coil Sensitivity Extraction," *Magnetic Resonance in Medicine* 47:529-538 (2002).
Ehman R.L. et al., "Adaptive Technique for High-Definition MR Imaging of Moving Structures," *Radiology* 1989; 173: 255-263.

\* cited by examiner

*Primary Examiner*—Diego Gutierrez
*Assistant Examiner*—Jeremiah Shipman
(74) *Attorney, Agent, or Firm*—Ziolkowski Patent Solutions Group, SC; Michael A. Della Penna; Carl B. Horton

(57) ABSTRACT

A system and method for MR imaging with coil sensitivity or calibration data acquisition for reducing wrapping or aliasing artifacts is disclosed. Low resolution MR data representative of coil sensitivity of a coil arrangement within an FOV is acquired prior to application of an imaging data acquisition scan and is used to reduce wrapping or aliasing artifacts in a reconstructed image.

33 Claims, 4 Drawing Sheets

METHOD AND APPARATUS OF M/R IMAGING WITH COIL CALIBRATION DATA ACQUISITION

BACKGROUND OF INVENTION

The present invention relates generally to fast MR imaging and, more particularly, to MR imaging with the acquisition of coil sensitivity calibration data.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_z$ may be rotated, or "tipped", into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

Increasingly, there is a desire to expedite MR imaging. Expeditiously executing an MR scan not only increases patient throughput but also reduces the likelihood of motion-induced artifacts in the reconstructed images. To this end, a number of imaging techniques have been developed to expedite the MR data acquisition process. For instance, Fast Spin Echo (FSE), Fast Gradient Recalled Echo (FGRE), Echo Planar Imaging (EPI), and spiral imaging are examples of a few imaging techniques that have been developed to expedite MR data acquisition. The aforementioned fast imaging techniques are similar in that data acquisition is expedited in a manner by which the imaging volume is excited and sampled. While such techniques alone have made substantial advances in scan time, parallel imaging techniques can further accelerate data acquisition. Parallel imaging utilizes an array of surface coils to increase the step size between phase-encoding lines, or equivalently by reducing the size of the field of view and the amount of data collected.

Parallel imaging techniques not only expedite data acquisition, but are particularly advantageous in reducing aliasing or wrapping that occurs in the phase-encoding direction when an imaging object extends outside a field-of-view (FOV). In particular, parallel imaging techniques remove or reduce the aliasing by using surface coil $B_1$ fields (sensitivities), to define or determine an unaliased spin distribution. This unaliased spin distribution may then be used to reduce, negate, or offset the aliasing or wrapping that may occur from imaging an object that extends outside the FOV. Moreover, parallel imaging techniques are often preferred since they may be carried out in half the scan time of a conventional MR scan.

Two exemplary parallel imaging reconstruction techniques have been developed to reduce aliasing in a reconstructed image. SENSitivity Encoding (SENSE) and SiMultaneous Acquisition of Spatial Harmonics (SMASH) are two such imaging techniques that remove aliasing in the image and k-space domains, respectively. In addition, several variations of the SMASH technique have been developed including AUTOSMASH and GeneRalized Auto-Calibrating Partially Parallel Acquisition (GRAPPA).

As mentioned above, parallel imaging techniques reduce aliasing using surface coil $B_1$ fields to find an unaliased spin distribution. Information regarding the surface coil $B_1$ fields or sensitivities is typically acquired with an external calibration or a self-calibration technique. With an external calibration, a separate scan distinct from the reduced FOV SENSE or SMASH scan acquires data over the subject volume to be scanned with the SENSE or SMASH scan. The external calibration method typically uses a conventional 2D or 3D gradient echo pulse sequence that is usually relatively fast (a few seconds to a minute) with low spatial resolution (e.g. 32×32×32 matrix for a 48×48×48 cm FOV), and acquires data from the full FOV, i.e. an FOV that will fully contain the subject anatomy to be scanned.

The external calibration method, while reasonably effective, does have drawbacks. For instance, the external calibration method can give rise to artifacts in the reconstructed image if the subject moves between application of the calibration scan and the imaging data acquisition (SENSE or SMASH scan). This can be particularly problematic for axial planes with breathholding if the breathhold size between the two scans is different. Additionally, the external calibration technique requires operator involvement to prescribe the scan and acquire the data, as well as requires the operator to correctly choose the calibration scan volume and location. That is, scanning a calibration volume that is smaller than the imaging data volume, or mis-centering the calibration volume, will result in slices that cannot be unwrapped or have poor alias unwrapping. Further, if multiple scan stations are used for parallel imaging at each station, the calibration volume must be prescribed for each station thereby further increasing the burden imposed on the operator when prescribing the calibration scan volume and location.

With the self-calibration or auto-calibration technique, instead of increasing the step size between phase encoding lines over the entire k-space during the SENSE or SMASH scan, the normal step size is used for a small number of lines near the center of k-space, e.g. 32 lines. These Nyquist-sampled lines are used to determine or otherwise calculate an image giving a sensitivity map or, in the context of AUTO-SMASH and GRAPPA, directly restore missing k-space lines without the step of reconstructing a calibration image. Similar to the external calibration method, however, the self or auto-calibration technique also has several drawbacks. For instance, the FOV of the calibration data is necessarily the same as the FOV of the SENSE or SMASH scan. Since the SENSE or SMASH scan usually does not image the full FOV, in order to reduce scan time and increase spatial resolution, the resulting calibration data may have aliasing or wrapping in the phase-encoding direction. That is, aliasing in the calibration data results in incomplete unwrapping of aliasing in the SENSE or SMASH acquired data. Moreover, since SENSE or SMASH-prescribed scans deliberately provide very low signal from static tissue, for instance, vascular imaging with paramagnetic contrast agents such as gadolinium, the resulting calibration will, therefore, also have very low signal which may negatively affect the accuracy of the acquired sensitivity data. Further, in contrast to the benefits of parallel imaging, self-calibration increases scan time. When very high reduction factors are used, the relative increase in scan time can be substantial.

It would therefore be desirable to have a system and method of MR imaging with aliasing or wrapping artifact reduction with an overall reduction in scan time.

BRIEF DESCRIPTION OF INVENTION

The present invention provides a system and method of MR imaging that overcomes the aforementioned drawbacks. The imaging technique of the present invention acquires a reduced set of MR data that is appended to or interleaved with MR data acquired from an MR imaging scan to measure or otherwise determine coil sensitivity to an imaging volume. With the present invention, a navigated calibration data acquisition short in duration is carried out immediately prior to a parallel imaging scan, such as SENSE or SMASH. The navigated data acquisition is carried out immediately before the imaging data acquisition so that the probability of subject motion is reduced. Additionally, the parameters of the navigated calibration scan as well as the scan volume can be set to solely depend upon the receive coils thereby providing higher calibration signal and full FOV coverage. Additionally, the scan time is reduced when compared to the scan times typically associated with self-calibration techniques. Moreover, operator involvement is significantly reduced for the calibration data acquisition thereby increasing convenience, usability, and throughput while eliminating the likelihood of operator error in the scan volume prescription. In addition, the present invention can acquire coil sensitivity data using the same plane orientation as the imaging data acquisition scan. The present invention is also applicable with a number of types of imaging sequences including, but not limited to FSE, FGRE, EPI, and spiral imaging.

Therefore, in accordance with one aspect, the present invention includes a method of MR imaging. The method includes defining an FOV relative to a multi-coil arrangement and repeatedly applying an imaging sequence to acquire MR imaging data from the FOV for image reconstruction. The method also includes the step of playing out before at least one application of the imaging sequence a calibration sequence to acquire data of coil sensitivity within the defined FOV.

In accordance with another aspect of the present invention, an MRI apparatus includes a plurality of gradient coils positioned about a bore of a magnet to impress a polarizing magnetic field. An RF transceiver system and an RF switch are controlled by a pulse module to transmit and receive RF signals to and from an RF assembly to acquire MR images. The MRI apparatus further includes a computer programmed to apply a navigated calibration pulse sequence between applications of an imaging pulse sequence to acquire calibration data indicative of $B_1$ field strength across an FOV. The computer is further programmed to apply a parallel imaging sequence to acquire MR data for image reconstruction. The computer is also programmed to reconstruct an image of a subject from MR data acquired from an array of surface coils and use the acquired calibration data to reduce aliasing in the image.

According to another aspect of the present invention, the invention is embodied in a computer program stored on a computer readable storage medium and having instructions which, when executed by a computer, cause the computer to define an FOV. The computer is also caused to play out a calibration sequence to acquire low resolution MR data from the FOV indicative of field strength sensitivities in an array of surface coils. The computer is also caused to apply an imaging sequence after application of the calibration sequence to acquire imaging data from the FOV with the array of surface coils. The set of instructions then causes the computer to reduce artifacts in the imaging data caused by the field strength sensitivities.

Various other features, objects, and advantages of the present invention will be made apparent from the following detailed description and the drawings.

BRIEF DESCRIPTION OF DRAWINGS

The drawings illustrate one preferred embodiment presently contemplated for carrying out the invention.

In the drawings.

DETAILED DESCRIPTION

A system is shown to acquire MR data consistent with the principles of parallel imaging. In this regard, the imaging system includes, as will be described in greater detail below, a phased-array coil arrangement to acquire MR data from an FOV. As described above, parallel imaging is a data acquisition technique that is often used for those applications where it is desired to expedite the acquisition of MR data from a subject. Further, the present invention will be described with respect to a spiral sampling of k-space. One skilled in the art will appreciate that the present invention is equivalently applicable with other types of fast acquisitions such as FSE, FGRE, EPI, and the like.

Figure 1:
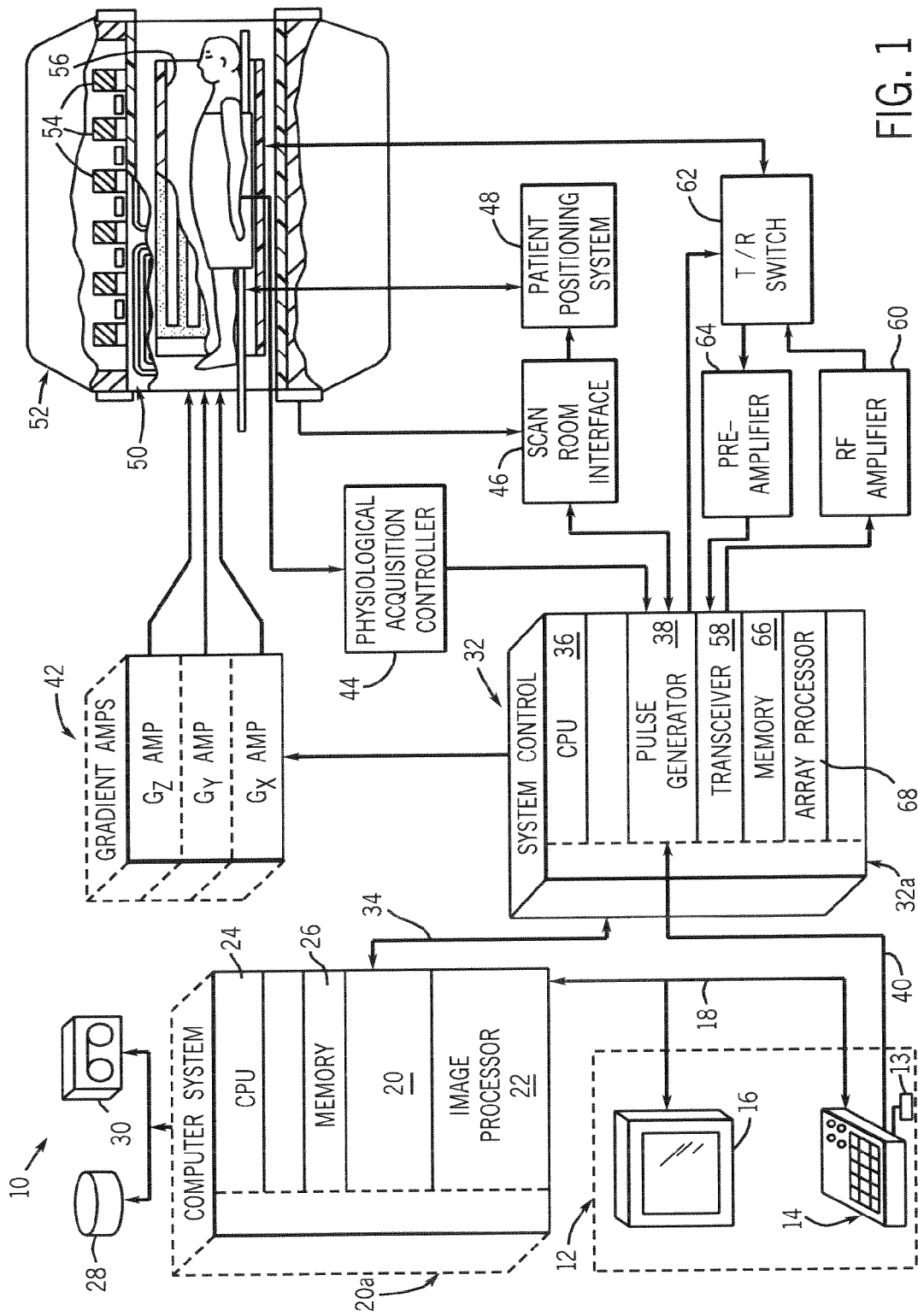
FIG. 1 is a schematic block diagram of an MR imaging system for use with the present invention.

Referring now to FIG. 1, the major components of a preferred magnetic resonance imaging (MRI) system 10 incorporating the present invention are shown. The operation of the system is controlled from an operator console 12 which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These include an image processor module 22, a CPU module 24 and a memory module 26, known in the art as a frame buffer for storing image data arrays. The computer system 20 is linked to disk storage 28 and tape drive 30 for storage of image data and programs, and communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having $G_x$, $G_y$, and $G_z$ amplifiers. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory, such as disk storage 28. In response to commands received from the operator console 12, this image data may be archived in long term storage, such as on the tape drive 30, or it may be further processed by the image processor 22 and conveyed to the operator console 12 and presented on the display 16.

Figure 2:
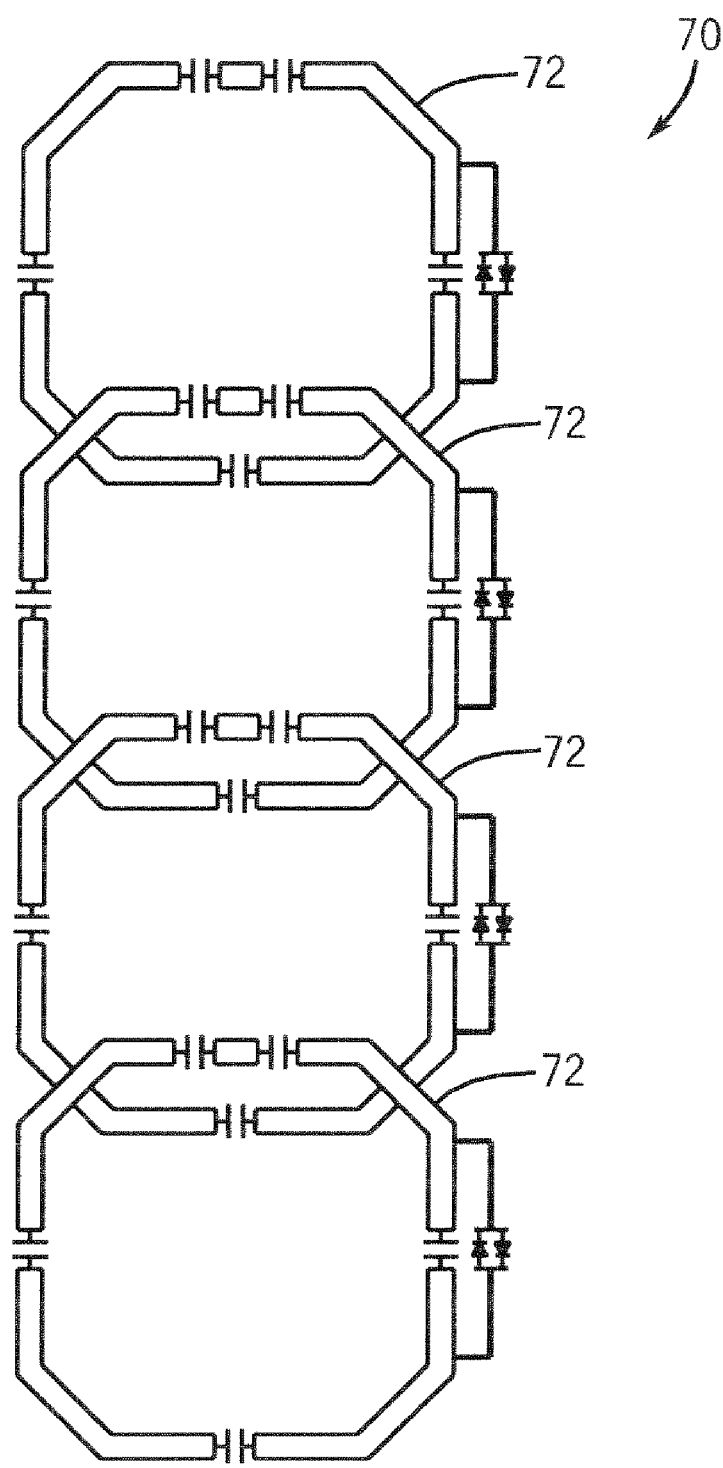
FIG. 2 is a schematic diagram of a phased-array coil arrangement.

Parallel imaging techniques reduce MR data acquisition time by using an array of surface coils for receiving signals from excited nuclei in the FOV. A four coil phased-array arrangement is illustrated in FIG. 2. In contrast to volume coils, a surface coil arrangement 70 such as that illustrated in FIG. 2 is typically placed adjacent to the subject to be imaged. Additionally, while some coils can operate as both the transmitter of the $B_1$ field as well as the receiver of the RF signal, a phased-array surface coil arrangement is typically used to only receive an RF signal. Phased-array surface coils are commonly used because of their good SNR characteristics for tissues adjacent to the coil. In this regard, the phased-array coil arrangement 70 is typically sized smaller than the imaging subject and is, therefore, implemented to acquire MR data from a targeted or localized region or volume of the subject. Coil arrangement 70 includes four linearly arranged RF coils 72 that partially overlap one another. One skilled in the art will appreciate, however, that the present invention is equivalently applicable with phased-array coil arrangements having fewer or more than four RF coils. Additionally, the present invention is equivalently applicable with phased-array volume coil arrangements and transmit/receive coils.

As described above, the present invention is directed to the acquisition of calibration or coil sensitivity data in conjunction with parallel imaging techniques using navigator scans. A navigator is a scan constructed to acquire a reduced set of k-space data that is appended or interleaved with other scans. Navigator scans have been shown to be effective for monitoring subject motion and other effects such as B0 drift. Additionally, as described herein, this reduced set of k-space data can be used to measure coil sensitivity to a FOV. While the present invention will be specifically described with respect to a spiral calibration pulse sequence or navigator, it is contemplated that any fast pulse sequence could be used for the navigated calibration. That is, a 2D or 3D acquisition may be combined with FGRE, EPI, FSE, or imaging sequences.

An FSE technique uses multiple phase encoding steps in conjunction with multiple 180 degree refocusing RF pulses per TR interval to produce a train of echoes. Each echo experiences differing amounts of phase encoding that correspond to different lines in k-space. The effective echo time is determined when the central views in k-space are acquired, which are usually the first echoes. Subsequent echoes are usually spaced apart with the same echo spacing time, with the latest echoes farthest from the center. It has been shown that this phase ordering achieves the best SNR by acquiring low frequency information with the least T2 decay. The FSE imaging technique has the advantage of spin echo image acquisition, namely, immunity from external magnetic field inhomogeneities with significant faster acquisition time. However, since each echo experiences different amounts of T2 decay, image contrast differences may be caused when compared with conventional spin echo images of similar TR and TE.

An FGRE acquisition is similar to a spin echo sequencing save a readout gradient reversal is substituted for the 180 degree pulse. The acquisition sequence is repeated for each phase encoding step. With small flip angles and gradient reversals, a considerable reduction in TR and TE is possible for fast image acquisition.

EPI acquisition is a technique that provides extremely fast imaging time. Single shot or multi-shot EPI is equivalently applicable with the present invention. For a single shot EPI, image acquisition typically begins with a standard 90 degree flip followed by phase encoding or frequency encoding gradient application to initiate the acquisition of data in the periphery of k-space followed by a 180 degree echo producing RF pulse. Immediately thereafter, an oscillating readout gradient and phase encoding gradient are continuously applied to stimulate echo formation and rapidly fill k-space in a stepped pattern. Because of its extremely fast repetition time, EPI is commonly used for cardiac evaluation in conjunction with electrocardiogram gating for high temporal and reasonable spatial resolution image acquisition.

Figure 3:
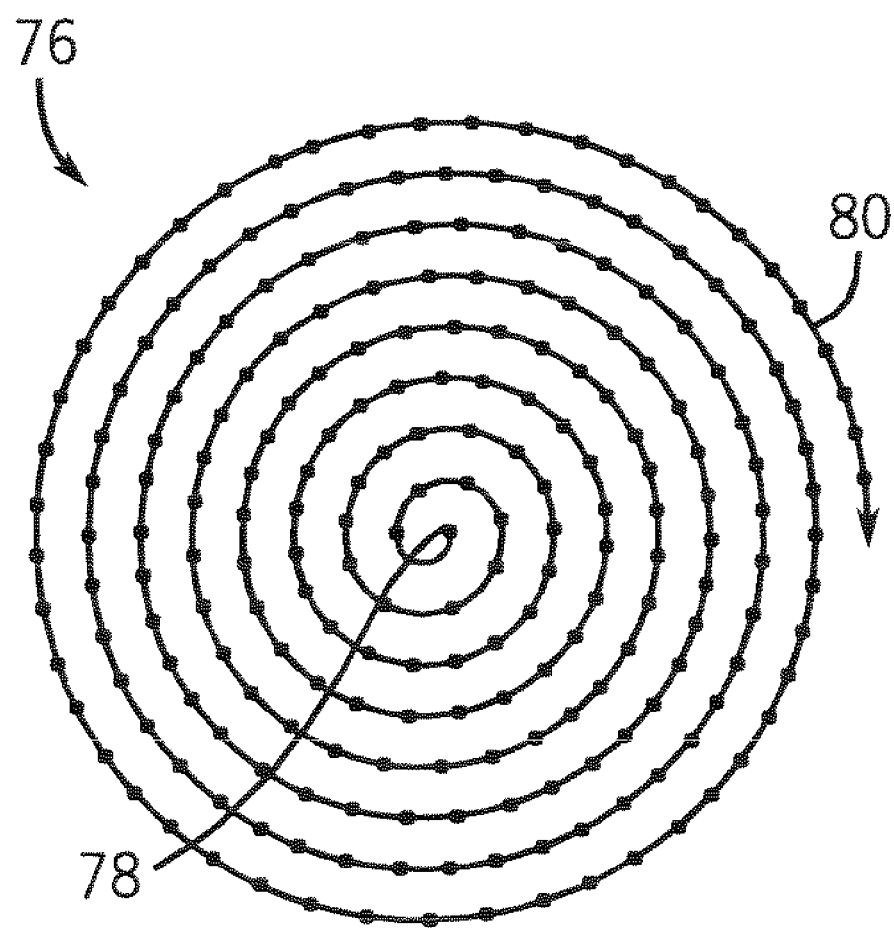
FIG. 3 is a schematic representation of a spiral acquisition in accordance with the present invention.

Another method of filling k-space involves the simultaneous oscillation of phase encoding gradients and frequency encoding gradients to sample data points during echo formation in a spiral. "Spiral encode acquisition" samples data at the origin (the center of k-space) with sampling spirally outwardly to the periphery of k-space. Such a spiral acquisition 76 is schematically illustrated in FIG. 3.

As shown, acquisition or sampling begins for the center of k-space 78 with a spiraling of sampling toward the periphery 80. As described above, spiral data acquisition α-curs with sinusoidal oscillation of the phase encoding gradients and frequency encoding gradients 90 degrees out of phase with respect to one another. Spiral scanning is generally considered an efficient method for acquiring data when sampling information in the center of k-space, where the bulk of image information is contained. Spiral imaging is commonly used for cardiac dynamic imaging and functional neuroimaging. Spiral acquisition 76 represents a single shot acquisition. However, the present information is equivalently applicable with multi-shot acquisitions. As will be described in greater detail below, the present invention is particularly applicable with a four interleaved spiral or four arm acquisition.

Figure 4:
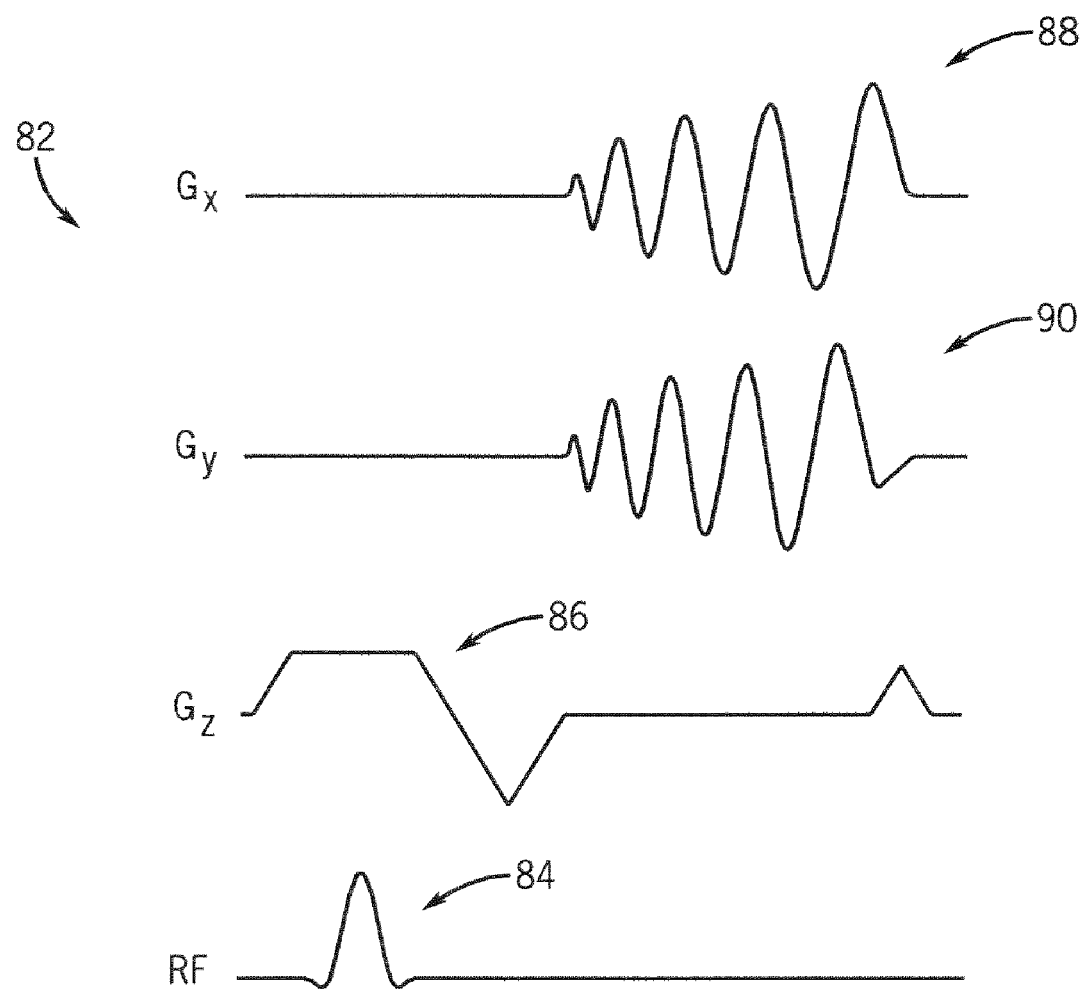
FIG. 4 represents a 2D spiral calibration pulse sequence in accordance with the present invention.

Notwithstanding the applicability with FGRE, EPI, FSE, and equivalent techniques, in a preferred embodiment, a 2D spiral calibration scan such as that illustrated in FIG. 4 is preferred. Spiral scan 82 includes an RF pulse 84 and a simultaneously applied slice select gradient 86. Following application of slice select gradient 86 is the simultaneous, but out-of-phase application of phase encoding gradient 88 and frequency encoding gradient 90. As illustrated, the frequency encoding gradient and phase encoding gradient are out of phase from one another by 90 degrees.

Spiral scan 82 represents a spiral calibration pulse sequence that is interleaved between application or playing out of an imaging pulse sequence such as a SENSE or SMASH scan. Further, the illustrated spiral scan 82 represents one of four interleaved pulse sequences that are played out before, during, or after, application of a SENSE, SMASH, or equivalent scan. It is preferred that spiral scan 82 be played out immediately prior to application of the imaging data acquisition so as to reduce the probability of subject motion between the calibration data acquisition and the imaging data acquisition. Moreover, in one embodiment, the calibration data is acquired from a calibration FOV whereas imaging data is acquired from an image FOV that is different from the calibration FOV. In this regard, the image FOV is typically sized to be within the calibration FOV and, as such, the acquisition of calibration data includes data acquisition from the image FOV that can be used to reduce artifacts in the reconstructed image. For instance, the calibration FOV includes the entire spatial coverage of the phased array coil architecture, but the image FOV, i.e. the portion of the subject of which an image will be reconstructed, would include a fraction of the spatial coverage of the phased array coils.

A 2D spiral scan such as that illustrated in FIG. 4 has a number of advantages. For instance, to acquire 32 lines of data in three dimensions in one second or less would mandate either implementation of multiple excitations with very short TR or a single excitation combined with FSE, EPI, or spiral readout. A 3D FGRE would require a TR of one millisecond; however, such a short TR will result in extremely low signal. Conversely, if a single excitation with EPI, FSE, or spiral readout is used, the artifacts may be excessive because of the extremely long echo train or readout time required for a 3D acquisition. For instance, geometric distortion may occur with EPI, blurring with FSE, as well as blurring with spiral readout. Another drawback of 3D pulse sequences is aliasing or wrapping in the slice direction as a result of RF pulses that do not provide perfectly rectangular slab profiles, i.e. slab wrap. Such wrapping may be detrimental to sensitivity calibration. It is known, however, that such wrapping can be eliminated by using RF pulses that have better spatial selectivity or by acquiring a larger calibration volume in the final desired volume. Both solutions, however, require longer scans and, therefore, negatively affect patient throughput and are also susceptible to subject-induced motion artifacts.

In contrast, with a 2D pulse sequence, the echo train is relatively short such that a single excitation may be used with EPI, FSE, or spiral readout to obtain high signal. Both EPI and FSE require special calibrations (reference scans or phase corrections) to decrease ghosting caused by eddy currents. Even with such calibrations, ghosting may not be eliminated and, therefore, be problematic for sensitivity calibration because ghosting signal would be incorrectly interpreted as coil sensitivity thus causing incorrect alias unwrapping with SENSE or SMASH scans. EPI is also susceptible to geometric distortion from off-resonance spins which may be problematic given the geometric shape of the sensitivity in the calibration image may likely be different from its shape in the SENSE or SMASH image. In contrast, spiral scans are insensitive to eddy currents and do not require special calibrations.

In addition, a major advantage of a spiral scans is its inherent increased efficiency thus resulting in lower scan time than comparable pulse sequences that use a Cartesian k-space trajectory. The fast acquisition of a spiral navigated calibration in accordance with the present invention is further illustrated in the following example.

With typical gradient parameters of 22 mT/cm and 100 T/m/sec, a 15 mm in-plane spatial resolution (32×32 matrix size for 48×48 cm FOV) may be obtained with four spiral arms and a readout time of 1.5 msec per arm (384 readout points acquired with readout bandwidth of 125 kHz). Optimizing the pulse sequence waveforms yields a TE of 1 msec and a TR of 4 msec. As such, a complete 2D image may be acquired in 16 msec, thereby, enabling a stack of 32 slices to be acquired in 0.5 seconds. This is generally considered to be more than twice as fast as most other pulse sequences. In the event that higher slice resolution is required, 64 slices may be acquired in one second. In contrast, most clinical scans with similar parameters take between several seconds and several minutes to complete.

The scan time advantage achieved with a spiral-navigated calibration when compared to known self-calibration techniques is illustrated by the following example. For a 3D time-of-flight scan used in the vascular imaging of the head with a typical TR of 40 msec, 32 slice encodes, 128 phase encodes, and three slabs, the normal scan time is 8.2 minutes. If a SENSE or SMASH 3D time-of-flight scan is used without self-calibration and with a reduction factor of two in both the slice and phase directions for a total reduction factor of four, the scan time is reduced to approximately two minutes. If self-calibration is used with typical values of eight Nyquist-spaced slice encodes and 32 Nyquist-spaced phase encodes in the center of k-space, the scan time increases to 3.2 minutes. In this case, self-calibration increases the SENSE or SMASH scan time by more that fifty percent. In contrast, spiral-navigated calibration in accordance with the present invention would add approximately one second or less to the overall scan time.

Another advantage of carrying out the present invention as a spiral scan is that the disadvantages often associated with spiral scans have limited negative impact. That is, spiral scans have the disadvantage that off-resonance spins appear blurry in a reconstructed image. However, because the sensitivity calibration data is acquired with a low spatial resolution, if four spiral arms are used, a very short readout per spiral arm can be used, i.e. 1.5 msec. Such a short readout results in negligible blurring even from subcutaneous fat. De-blurring corrections that are typically used with spiral scans are, therefore, unnecessary.

In addition, artifacts from aliasing with spiral scans appear in the reconstructed image as a ring of signal instead of wrapping or aliasing typically encountered with non-spiral acquisitions. The aliased signal in the calibration images may be problematic since it may be interpreted as coil sensitivity and be susceptible to erroneous alias unwrapping. However, it is contemplated that by increasing the spiral scan FOV to include all of the subject anatomy, the aliasing ring would then sit no closer than the edge of the scan FOV and, therefore, may be eliminated by blanking everything in the calibration images outside a circle with diameter equal to the scan FOV.

As referenced above, the navigated calibration sequence is designed to acquire low resolution coil sensitivity data. This low resolution volume of sensitivity data is then interpolated to estimate values at the pixels to be constructed in the SENSE or SMASH scans. This interpolation step may take a substantial fraction of the total reconstruction time. If the calibration data has a different slice orientation than the SENSE or SMASH scan (axial versus oblique, for example), a large volume of the calibration data must then be stored in an array processor fast memory for execution of the interpolation step. Since array processor memory is limited, both the number of sensitivity lines and the in-plane matrix size of the slices are restricted. Therefore, the calibration data must also be transferred between "slow" memory and the array processor. This step takes a non-negligible amount of time compared to other steps in a reconstruction process. If the calibration data and the SENSE or SMASH scan data has the same slice orientation, however, a much smaller volume of data can be stored in the array processor. Storing a smaller volume allows the sensitivity in-plane matrix size to be larger which, therefore, allows more calibration slices and reduces the amount of data that needs to be transferred. As a result, reconstruction time is decreased by having the navigated calibration scan acquire sensitivity data using the same scan plane orientation as the imaging data acquisition scan, i.e. SENSE or SMASH scan.

While the present invention has heretofore been described with respect to parallel imaging scans, it is recognized that the present invention may also have applicability in correcting intensity shading that may occur when imaging with an array of coils. In this regard, the above described invention may be used to reduce artifacts caused by field strength insensitivities in parallel and non-parallel scans.

Therefore, the present invention includes a method of MR imaging. The method includes defining an FOV relative to a multi-coil arrangement and repeatedly applying an imaging sequence to acquire MR imaging data from the FOV for image reconstruction, possibly with a reduced amount of k-space data. The method also includes the step of playing out before at least one application of the imaging sequence a calibration sequence to acquire data of coil sensitivity within the defined FOV.

An MRI apparatus is disclosed and includes a plurality of gradient coils positioned about a bore of a magnet to impress a polarizing magnetic field. An RF transceiver system and an RF switch are controlled by a pulse module to transmit and receive RF signals to and from an RF assembly to acquire MR images. The MRI apparatus further includes a computer programmed to apply a navigated calibration pulse sequence between applications of an imaging pulse sequence to acquire calibration data indicative of $B_1$ field strength across an FOV. The computer is further programmed to apply a parallel imaging sequence to acquire MR data for image reconstruction. The computer is also programmed to reconstruct an image of a subject from MR data acquired from an array of surface coils and use the acquired calibration data to reduce aliasing in the image.

The invention is also embodied in a computer program stored on a computer readable storage medium and having instructions which, when executed by a computer, cause the computer to define an FOV. The computer is also caused to play out a calibration sequence to acquire low resolution MR data from the FOV indicative of field strength sensitivities in an array of surface coils. The computer is also caused to apply an imaging sequence after application of the calibration sequence to acquire imaging data from the FOV with the array of surface coils. The set of instructions then causes the computer to reduce artifacts in the imaging data caused by the field strength sensitivities.

The present invention has been described in terms of the preferred embodiment, and it is recognized that equivalents, alternatives, and modifications, aside from those expressly stated, are possible and within the scope of the appending claims.

What is claimed is:

1. A method of MR imaging comprising the steps of:
defining a calibration FOV and an image FOV relative to a multi-coil arrangement, wherein the calibration FOV is different from the image FOV;
repeatedly applying an imaging sequence to acquire MR imaging data from the image FOV for image reconstruction; and
playing out before at least one application of the imaging sequence a calibration sequence to acquire data of coil sensitivity from the calibration FOV.

2. The method of claim 1 her comprising the step of playing out the calibration sequence before each application of the imaging sequence.

3. The method of claim 1 further comprising the step of acquiring a reduced set of k-space data after playing out of the calibration sequence.

4. The method of claim 3 further comprising the step of adjusting at least one of scan parameters and scan volume of the calibration sequence based on receiver coil characteristics.

5. The method of claim 3 further comprising the step of appending the reduced set of k-space data to the MR imaging data acquired from a previously or subsequently applied imaging sequence.

6. The method of claim 1 further comprising the step of defining the imaging sequence to acquire MR imaging data along a plane similar to a plane from which the calibration sequence acquires coil sensitivity data.

7. The method of claim 1 wherein the calibration sequence and imaging sequence are fast pulse sequences.

8. The method of claim 6 wherein the imaging sequence and the calibration sequence are one of an FGRE, EPI, FSE, and a spiral sequence.

9. The method of claim 7 wherein the MR imaging data includes one of 2D and 3D data.

10. The method of claim 7 further comprising the step of defining the calibration sequence to match the imaging sequence.

11. The method of claim 1 wherein the calibration sequence is a four-arm spiral sequence.

12. The method of claim 1 wherein the imaging sequence is one of a SENSE or SMASH sequence and further comprises the step of playing out the calibration sequence near-immediately prior to, during, or after the SENSE or SMASH imaging sequence to reduce probability of subject motion between applications of the calibration sequence and the imaging sequence.

13. The method of claim 1 further comprising the step of playing out the calibration sequence relative to the imaging sequence such that probability of subject motion between applications of the calibration sequence and the imaging sequence is reduced.

14. The method of claim 1 wherein the calibration FOV is larger than the image FOV and includes the image FOV.

15. An MRI apparatus comprising:
a magnetic resonance imaging (MRI) system having a plurality of gradient coils positioned about a bore of a magnet configured to impress a polarizing magnetic field and an RF transceiver system and an RF switch controlled by a pulse module to transmit RF signals to an RF coil assembly to acquire MR images, the RF coil assembly including an array of RF coils; and
a computer programmed to:
apply a navigated calibration pulse sequence to acquire calibration data from a region corresponding to a spatial coverage of the array of RF coils, the calibration data indicative of $B_1$ field strength across the spatial coverage;
apply a parallel imaging sequence to acquire MR data for image reconstruction from an image FOV that is smaller in spatial coverage than the spatial coverage of the array of RF coils; and
reconstruct an image of a subject from MR data acquired from the array of RF coils and use the calibration data to reduce aliasing in the image.

16. The MRI apparatus of claim 15 wherein the computer is further programmed to define a calibration FOV from which calibration data is acquired and define an image FOV from which MR data for image reconstruction is acquired.

17. The MRI apparatus of claim 15 wherein the computer is further programmed to acquire the calibration data across the FOV.

18. The MRI apparatus of claim 15 wherein the array of RF coils are surface coils and wherein the computer is further programmed to define the navigated calibration pulse sequence to acquire low resolution MR data of individual surface coil sensitivity within the FOV.

19. The MRI apparatus of claim 18 wherein the computer is further programmed to define the navigated calibration pulse sequence to acquire calibration data from a volume fixed in size.

20. The MRI apparatus of claim 15 wherein the computer is further programmed to define the navigated calibration pulse sequence as one of an FGRE, an FSE, an EPI, or a spiral sequence.

21. The MRI apparatus of claim 15 wherein the computer is further programmed to acquire the calibration data with a 2D spiral pulse sequence.

22. The MRI apparatus of claim 15 wherein the parallel imaging sequence includes one of a SMASH and a SENSE imaging sequence.

23. The MRI apparatus of claim 15 wherein the computer is further programmed to interleave application of the navigated calibration pulse sequence between repeated applications of the parallel imaging sequence.

24. The MRI apparatus of claim 15 wherein the computer is further programmed to acquire a reduced set of k-space data following application of the navigated calibration pulse sequence and append the reduced set of k-space data to k-space data acquired with the parallel imaging sequence.

25. A computer readable storage medium having a computer program stored thereon and representing a set of instructions that when executed by a computer causes the computer to:
define an FOV;
play out a calibration sequence to acquire low resolution MR data from within the FOV and from outside the FOV, the low resolution MR data being indicative of field strength sensitivities in an array of surface coils;
apply an imaging sequence after application of the calibration sequence to acquire imaging data from the FOV with the array of surface coils; and
reduce artifacts in the imaging data caused by the field strength sensitivities.

26. The computer readable storage medium of claim 25 wherein the computer is further caused to acquire the low resolution MR data along a plane of orientation that matches a plane of orientation along which the imaging data is acquired.

27. The computer readable storage medium of claim 25 wherein the computer is further caused to define the calibration sequence as one of a 2D and a 3D acquisition.

28. The computer readable storage medium of claim 27 wherein the computer is further caused to define the calibration sequence as one of an FGRE, an FSE, an EPI, or a spiral acquisition.

29. The computer readable storage medium of claim 25 wherein the calibration sequence includes navigator scans that acquire a reduced set of k-space data.

30. The computer readable storage medium of claim 25 wherein the computer is further caused to repeatedly apply the imaging sequence to image the FOV, and apply the calibration sequence before each application of the imaging sequence to acquire low resolution MR data before the acquisition of imaging data.

31. The computer readable storage medium of claim 25 wherein the computer is further caused to append acquired low resolution MR data to acquired imaging data.

32. The computer readable storage medium of claim 25 wherein the imaging sequence includes a parallel imaging sequence.

33. The computer readable storage medium of claim 25 wherein the computer is further caused to acquire a reduced set of k-space data with the calibration sequence and reduce artifacts in the imaging data caused by the reduced set of k-space data.

* * * * *

UNITED STATES PATENT AND TRADEMARK OFFICE
CERTIFICATE OF CORRECTION

PATENT NO. : 7,064,547 B1 Page 1 of 1
APPLICATION NO. : 10/710133
DATED : June 20, 2006
INVENTOR(S) : King et al.

It is certified that error appears in the above-identified patent and that said Letters Patent is hereby corrected as shown below:

On the cover page, col. 1, Title (54), line 1, delete "M/R" and substitute therefore --MR--; and Col. 10, line 37 (Claim 2), delete "her" and substitute therefore --further--.

Signed and Sealed this

Nineteenth Day of September, 2006

JON W. DUDAS
*Director of the United States Patent and Trademark Office*